United States Patent
Murakami

(10) Patent No.: US 9,927,700 B2
(45) Date of Patent: Mar. 27, 2018

(54) IMPRINT APPARATUS, AND METHOD OF MANUFACTURING ARTICLE

(71) Applicant: CANON KABUSHIKI KAISHA, Tokyo (JP)

(72) Inventor: Yosuke Murakami, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 688 days.

(21) Appl. No.: 14/491,014

(22) Filed: Sep. 19, 2014

(65) Prior Publication Data
US 2015/0091199 A1    Apr. 2, 2015

(30) Foreign Application Priority Data

Oct. 1, 2013    (JP) .................................. 2013-206804

(51) Int. Cl.
*B29C 59/00* (2006.01)
*G03F 7/00* (2006.01)
*B29L 31/00* (2006.01)

(52) U.S. Cl.
CPC ....... *G03F 7/0002* (2013.01); *B29L 2031/772* (2013.01)

(58) Field of Classification Search
CPC ....... B29C 59/00; B29C 59/002; B29C 59/02; B29C 59/026
USPC ...................................... 264/40.1, 40.6, 293
See application file for complete search history.

(56) References Cited

U.S. PATENT DOCUMENTS

2013/0093113 A1    4/2013    Hayashi et al.

FOREIGN PATENT DOCUMENTS

| JP | 2007250767 A | * | 9/2007 |
| JP | 2013-098291 A | | 5/2013 |
| JP | 2013102132 A | | 5/2013 |
| JP | 2013175709 A | | 9/2013 |
| KR | 10-2013-0040727 A | | 4/2013 |
| WO | 2009153925 A1 | | 12/2009 |

OTHER PUBLICATIONS

English abstract of JP2007250767.*
Office Action issued in Korean Application No. KR10-2014-0126530 dated Jul. 6, 2016.
Office Action issued in Japanese Appln. No. 2013-206804 dated Jan. 19, 2018.

* cited by examiner

*Primary Examiner* — Christina Johnson
*Assistant Examiner* — Xue Liu
(74) *Attorney, Agent, or Firm* — Rossi, Kimms & McDowell LLP

(57) ABSTRACT

The present invention provides an imprint apparatus for molding an imprint material on a target region on a substrate using a mold to form a pattern on the target region, the apparatus comprising a heater configured to deform the target region by heating the substrate, a measurement device configured to measure an overlay state between the target region and the mold, and a controller configured to control the heater such that the overlay state falls within a tolerance.

12 Claims, 8 Drawing Sheets

IMPRINT APPARATUS, AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint technique of transferring a pattern formed on a mold to an imprint material on a substrate is attracting attention as one of mass-production lithography techniques for magnetic storage media, semiconductor devices, and the like. In an imprint apparatus using such technique, a mold having a pattern region on which a pattern is formed and an imprint material supplied onto a substrate are brought into contact with each other, and the imprint material is cured in this state. The pattern can be formed on the substrate by releasing the mold from the cured imprint material.

The manufacture of a semiconductor device or the like requires to transfer, in an imprint apparatus, the pattern of a mold by accurately overlaying the pattern with a shot region formed on a substrate. Accordingly, International Publication No. 2009/153925 has proposed a method of deforming a pattern region on a mold in accordance with a shot region by irradiating the mold with an infrared ray and heating it, and overlaying a substrate and the mold. In addition, Japanese Patent Laid-Open No. 2013-102132 has proposed a method of deforming a shot region by heating a substrate, and overlaying the substrate and a mold.

The methods described in International Publication No. 2009/153925 and Japanese Patent Laid-Open No. 2013-102132 merely decide a thermal dose (an amount of heating) to be applied to the mold or the substrate before starting to heat the substrate, and control heating based on the decided thermal dose. That is, International Publication No. 2009/153925 and Japanese Patent Laid-Open No. 2013-102132 do not describe a method of performing, while measuring a shape difference between the pattern region on the mold and the shot region on the substrate, feedback control of substrate heating based on the measurement result.

SUMMARY OF THE INVENTION

The present invention provides, for example, an imprint apparatus advantageous in terms of overlay precision.

According to one aspect of the present invention, there is provided an imprint apparatus for molding an imprint material on a target region on a substrate using a mold to form a pattern on the target region, the apparatus comprising: a heater configured to deform the target region by heating the substrate; a measurement device configured to measure an overlay state between the target region and the mold; and a controller configured to control the heater such that the overlay state falls within a tolerance.

Further features of the present invention will become apparent from the following description of exemplary embodiments with reference to the attached drawings.

DESCRIPTION OF THE EMBODIMENTS

Figure 1:
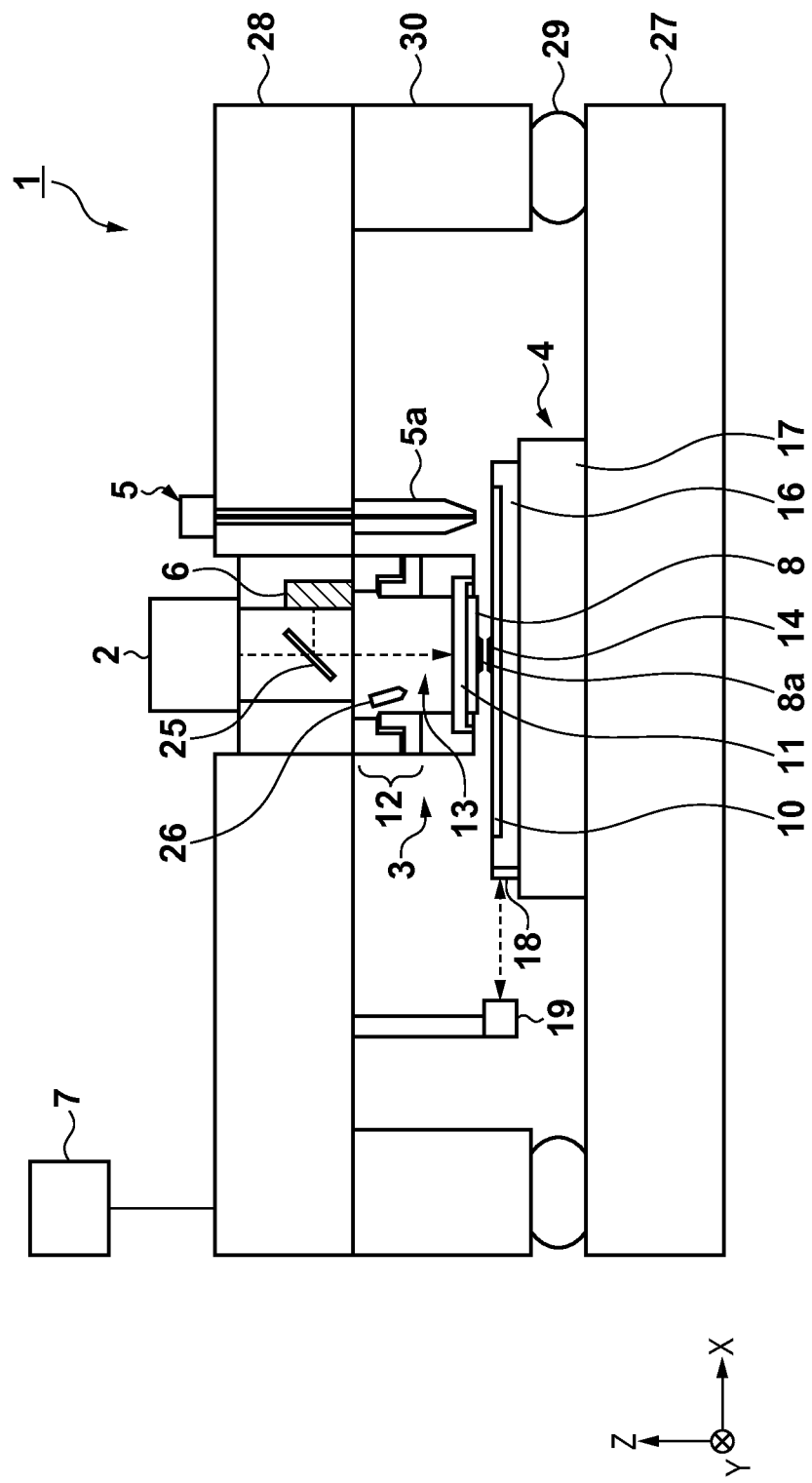
FIG. 1 is a view showing an imprint apparatus according to the first embodiment.

Exemplary embodiments of the present invention will be described below with reference to the accompanying drawings. Note that the same reference numerals denote the same members throughout the drawings, and a repetitive description thereof will not be given. Also, assume that directions which are perpendicular to each other on a substrate surface will be defined as X and Y directions, respectively, and a direction perpendicular to the substrate surface will be defined as a Z direction in the respective drawings.

First Embodiment

An imprint apparatus 1 according to the first embodiment of the present invention will be described with reference to FIG. 1. The imprint apparatus 1 molds, using a mold, an imprint material in a target shot region (target region) to which the pattern of a mold 8 is transferred and forms a pattern on the target region. For example, the imprint apparatus 1 is used to manufacture a semiconductor device or the like, and cures an imprint material (resin) on a substrate while the mold 8 having a pattern formed on it is in contact with the imprint material. The imprint apparatus 1 can transfer the pattern of a pattern region 8*a* on the mold 8 onto the substrate by widening the spacing between a substrate 10 and the mold 8 and releasing the mold 8 from the cured imprint material. Examples of a method of curing an imprint material are a heat cycle method using heat and a photo-curing method using light. The imprint apparatus 1 of the first embodiment adopts the photo-curing method. The photo-curing method is a method of curing an ultraviolet-curing resin (to be referred to as a resin 14 hereinafter) by supplying the uncured resin 14 as the imprint material onto a substrate, and irradiating the resin 14 with ultraviolet rays while the mold 8 and the resin 14 are in contact with each other. After the resin 14 is cured by ultraviolet irradiation, a pattern can be formed on the substrate by releasing the mold 8 from the resin 14.

FIG. 1 is a view showing the imprint apparatus 1 according to the first embodiment. The imprint apparatus 1 includes a mold holding unit 3, a substrate stage 4, an exposure unit 2, a heating unit 6 (heater), a resin supply unit 5, a stage position measurement unit 19, and an alignment measurement unit 26 (a measurement device). The imprint apparatus 1 also includes a control unit 7 (a controller) for controlling imprint processing (controlling each unit of the imprint apparatus 1). The control unit 7 is formed by a computer including a CPU and a memory, and can be connected to each unit of the imprint apparatus 1 via a line to control the unit according to a program and the like. The mold holding unit 3 is fixed to a bridge plate 28 supported by a base plate 27 via an antivibrator 29 and column 30. The substrate stage 4 is fixed to the base plate 27. The antivibrator 29 controls vibrations transmitted from a floor, on which the imprint apparatus 1 is installed, to the bridge plate 28.

The mold 8 is generally made of a material such as quartz capable of transmitting ultraviolet rays. A projection-and-recess pattern to be transferred to the substrate 10 is formed in a partial region (pattern region 8a) of the substrate-side surface of the mold 8. Furthermore, a cavity (concave portion) may be formed by recessing a surface on the opposite side of the substrate-side surface of the mold 8 so as to reduce the thickness of a portion around the pattern region 8a. By having such cavity and reducing the thickness of the portion around the pattern region 8a, it is possible to deform the pattern region 8a into a convex shape toward the substrate 10 when increasing the pressure of an opening region 13 (to be described later).

The mold holding unit 3 includes a mold chuck 11 for holding the mold 8 by, for example, a vacuum suction force or an electrostatic force, and a mold driving unit 12 for driving the mold chuck 11 in the Z direction. The mold driving unit 12 has the opening region 13 in its central portion (interior), and is configured such that the substrate 10 is irradiated, through the mold chuck 11 and the mold 8, with light emitted by the exposure unit 2 and the heating unit. A light-transmitting member (for example, a glass plate (not shown)) may be arranged in the opening region 13 such that a space defined by part of the opening region 13 and the cavity formed in the mold 8 serves as a hermetically-closed or hermetically-sealed space. If such light-transmitting member is arranged, a pressure regulation unit (not shown) is connected, via a pipe, to the space hermetically-closed or hermetically-sealed by the light-transmitting member, and regulates the pressure within the space. When, for example, the mold 8 and the resin 14 on the substrate are brought into contact with each other, the pressure regulation unit sets the pressure within the space to be higher than the external pressure, thereby deforming the pattern region 8a on the mold into a convex shape toward the substrate 10. This can bring the pattern region 8a into contact with the resin 14 on the substrate outward from the central portion of the pattern region 8a, thereby suppressing air bubbles trapped in the pattern of the mold 8. As a result, it is possible to prevent loss of the pattern transferred onto the substrate.

Figure 2:
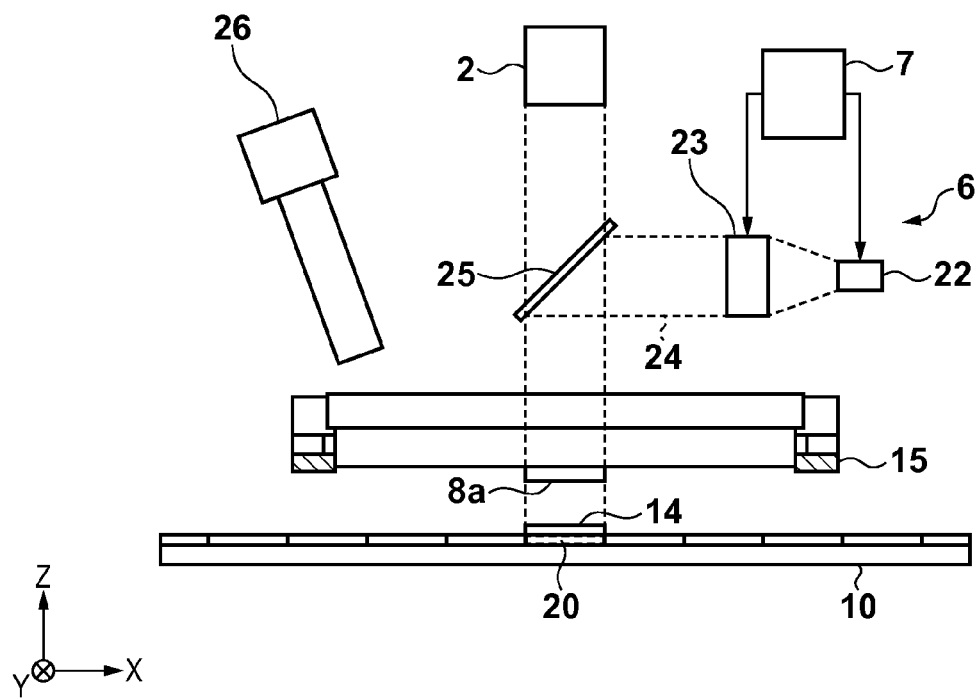
FIG. 2 is a view showing the configuration and the arrangement of an exposure unit and a heating unit.

At this time, deformation including components such as a magnification component, a trapezoid component, and a parallelogram component may have occurred in the pattern region 8a on the mold 8 due to a manufacturing error, heat deformation, or the like. As shown in FIG. 2, the mold holding unit 3 may include a deformation unit 15 (a deformation device) for deforming the mold 8 by applying a force to each of a plurality of portions on the side surface of the mold 8. The deformation unit 15 is formed by, for example, a plurality of actuators arranged so as to apply forces to each of four side surfaces of the mold 8. The plurality of actuators arranged in each side surface of the mold 8 independently applies forces to the plurality of portions on each side surface. This enables the deformation unit 15 to deform the pattern region 8a on the mold 8. As each actuator of the deformation unit 15, for example, a linear motor, an air cylinder, a piezoelectric actuator, or the like is used.

The mold driving unit 12 includes, for example, an actuator such as a linear motor or an air cylinder, and drives the mold chuck 11 (mold 8) in the Z direction to bring the mold 8 and the resin 14 on the substrate into contact with each other or release them from each other. Since the mold driving unit 12 is required to perform alignment with high accuracy when the mold 8 and the resin 14 on the substrate are brought into contact with each other, it may be formed by a plurality of driving systems including a coarse driving system and a fine driving system. In addition to the function of driving the mold in the Z direction, the mold driving unit 12 may have a position adjustment function of adjusting the position of the mold 8 in the X and Y directions and a ωZ direction (a rotation direction about the Z-axis), a tilt function of correcting the tilt of the mold 8, and the like. Although an operation of changing the distance between the mold 8 and the substrate 10 is performed by the mold driving unit 12 in the imprint apparatus 1 of the first embodiment, it may be performed by a stage driving unit 17 of the substrate stage 4 or by both of the mold driving unit 12 and the stage driving unit 17 relative to each other.

As the substrate 10, for example, a single-crystal silicon substrate, SOI (Silicon on Insulator) substrate, or the like is used. The resin supply unit 5 (to be described later) supplies the resin 14 (ultraviolet-curing resin) to the upper surface (processed surface) of the substrate 10.

The substrate stage 4 includes a substrate holding unit 16 and the stage driving unit 17, and drives the substrate 10 in the X and Y directions. The substrate holding unit 16 holds the substrate 10 by, for example, a vacuum suction force or an electrostatic force. The stage driving unit 17 mechanically holds the substrate holding unit 16, and drives the substrate holding unit 16 (substrate 10) in the X and Y directions. As the stage driving unit 17, for example, a linear motor or a planar motor may be used. The stage driving unit 17 may be formed by a plurality of driving systems including a coarse driving system and a fine driving system. Also, the stage driving unit 17 may have a driving function of driving the substrate 10 in the Z direction, a position adjustment function of adjusting the position of the substrate 10 by rotating the substrate 10 in the ωZ direction, a tilt function of correcting the tilt of the substrate 10, and the like.

The stage position measurement unit 19 includes, for example, a laser interferometer and an encoder, and measures the position of the substrate stage 4. A case in which the stage position measurement unit 19 includes a laser interferometer will be described. The laser interferometer emits a laser beam toward a reflecting plate 18 arranged on a side surface of the substrate stage 4, and detects a displacement from a reference position on the substrate stage based on the laser beam reflected by the reflecting plate 18. This enables the stage position measurement unit 19 to decide the current position of the substrate stage 4 based on the displacement detected by the laser interferometer. The stage position measurement unit 19 can include one or more laser interferometers for detecting a displacement in each of the X, Y, and Z directions of the substrate stage 4. In this case, the substrate stage 4 includes the reflecting plate 18 to correspond to each laser interferometer. This enables the stage position measurement unit 19 to measure positions in the X, Y, Z, ωX (a rotation direction about the X-axis), ωY (a rotation direction about the Y-axis), and ωZ directions of the substrate stage 4.

The alignment measurement unit 26 is arranged in the opening region 13 of the mold holding unit 3, and measures a shape in each of a plurality of shot regions formed on the substrate. As a method of measuring the shape in each of the plurality of shot regions, a plurality of alignment marks formed in each shot region are detected. For example, alignment marks are formed at the four corners of each shot region, and it is possible to measure the shape in each of the plurality of shot regions by detecting the alignment marks of the shot region. In addition, the alignment measurement unit 26 may measure the overlay state between the target shot region (target region) on the substrate to which the pattern of the mold 8 is transferred and the mold 8. The overlay state can include a shape difference indicating the difference between the shape of the pattern region 8a on the mold and that of the target shot region (target region) on the substrate to which the pattern of the mold is transferred. The alignment measurement unit 26 detects a plurality of alignment marks formed in each of the pattern region 8a and the shot region. The alignment marks of the pattern region 8a and those of the shot region are arranged such that they overlap each other when the pattern region 8a and the shot region coincide with each other in the X and Y directions. For each of the plurality of alignment marks of the pattern region 8a, the alignment measurement unit 26 arranged in the opening region 13 detects a positional shift amount between the alignment mark of the pattern region 8a and a corresponding one of the alignment marks of the shot region. This enables the alignment measurement unit 26 to measure the shape difference between the pattern region 8a and the shot region. The alignment measurement unit 26 will be described below as a unit for measuring the shape difference between the pattern region 8a and the shot region as the overlay state of the target region and the mold 8.

The resin supply unit 5 supplies (applies) the resin 14 (uncured resin) onto the substrate via a discharge nozzle 5a. As described above, in the first embodiment, an ultraviolet-curing resin 14 (imprint material) having a property that is cured upon ultraviolet irradiation is used. The resin 14 to be supplied from the discharge nozzle 5a of the resin supply unit 5 onto the substrate can be appropriately selected under various conditions in semiconductor device manufacturing steps. The amount of the resin discharged from the discharge nozzle 5a of the resin supply unit 5 can be appropriately decided in consideration of the thickness of the pattern to be formed on the resin 14 on the substrate, the density of the pattern, and the like. To sufficiently fill the pattern formed on the mold 8 with the resin 14 supplied onto the substrate, a given time may elapse while the mold 8 and resin 14 are in contact with each other.

The substrate 10 to which imprint processing is applied by the imprint apparatus 1 undergoes, for example, heat processing or the like in a film formation step such as sputtering and is loaded into the imprint apparatus 1 in a series of semiconductor device manufacturing steps. Therefore, deformation including components such as a magnification component, a trapezoid component, and a parallelogram component may have occurred in the shot region on the substrate. In this case, simply deforming the pattern region 8a on the mold 8 by the deformation unit 15 can be insufficient to align the shape of the pattern region 8a on the mold 8 and that of the shot region on the substrate with high accuracy. Hence, it is desirable to deform the shot region on the substrate to conform to the shape of the pattern region 8a on the mold 8 deformed by the deformation unit 15. To do this, the imprint apparatus 1 of the first embodiment includes the heating unit 6 which deforms the shape of the shot region by heating the substrate 10. The configuration and the arrangement of the exposure unit 2 and the heating unit 6 will be explained below with reference to FIG. 2. FIG. 2 is a view showing the configuration and the arrangement of the exposure unit 2 and the heating unit 6.

The exposure unit 2 can include a light source which emits light (ultraviolet rays) for curing the resin 14 on the substrate, and an optical system which shapes the light emitted by the light source into light appropriate for imprint processing. The heating unit 6 can include a light source 22 which emits light for heating the substrate 10, and a light adjustment unit 23 for adjusting the intensity of the light emitted by the light source 22. The heating unit 6 is configured to emit light 24 having a specific wavelength (for example, 400 nm to 2,000 nm) appropriate for heating the substrate 10 without curing the resin 14 supplied onto the substrate. As a method of causing the heating unit 6 to emit the light 24 having a specific wavelength, for example, the light source 22 of the heating unit 6 may be caused to directly emit light having the specific wavelength or an optical filter for transmitting only light having the specific wavelength may be arranged at the succeeding stage of the light source 22 of the heating unit 6. The light adjustment unit 23 of the heating unit 6 adjusts the intensity of light with which the substrate 10 is irradiated such that a temperature distribution in the shot region becomes a desired temperature distribution. As the light adjustment unit 23 of the heating unit 6, for example, a liquid crystal device, DMD (digital mirror device), and the like can be adopted. The liquid crystal device can change the intensity of light with which the substrate 10 is irradiated, by arranging a plurality of liquid crystal elements on a light-transmitting plane, and separately controlling voltages respectively applied to the plurality of liquid crystal elements. The digital mirror device can change the intensity of light with which the substrate 10 is irradiated, by arranging a plurality of mirror elements on a light-reflecting plane, and independently adjusting the plane direction of each mirror element.

It is desirable to arrange the heating unit 6 within the imprint apparatus 1 so as not to interrupt the optical path of ultraviolet rays which are emitted by the exposure unit 2 when curing the resin 14. To accomplish this, in the first embodiment, as shown in FIGS. 1 and 2, the heating unit 6 is arranged to emit light from an X-direction side surface above the opening region 13, and an optical member 25 which reflects the light emitted by the heating unit 6 and guides it onto the substrate can be arranged above the opening region 13. The optical member 25 can include, for example, a beam splitter which transmits light (ultraviolet rays) emitted by the exposure unit 2 and reflects the light 24 emitted by the heating unit 6.

As described above, the imprint apparatus 1 of the first embodiment includes the heating unit 6, and can deform a shot region 20 on the substrate by causing the heating unit 6 to irradiate the substrate 10 with light and apply heat to the substrate 10. That is, the imprint apparatus 1 of the first embodiment can deform, by the deformation unit 15, not only the pattern region 8a on the mold 8 but also the shot region 20 on the substrate. Furthermore, the imprint apparatus 1 of the first embodiment controls, while measuring a shape difference between the shot region 20 on the substrate and the pattern region 8a on the mold 8 by the alignment measurement unit 26, heating of the substrate 10 by the heating unit 6 such that the measured shape difference falls within a tolerance. If the shape difference measured by the alignment measurement unit 26 falls within the tolerance, the imprint apparatus of the first embodiment stops deformation of the shot region 20 by the heating unit 6, and brings the mold 8 and the resin 14 into contact with each other while the shape difference falls within the tolerance, thereby curing the resin 14.

As indicated by, for example, reference numeral 31 of FIG. 3, assume a case in which the heating unit 6 heats the substrate 10 while a thermal dose (to be referred to as a heat flow rate hereinafter) per unit time that the heating unit 6 applies to the substrate 10 remains the same. In this case, the shot region 20 is gradually deformed as indicated by reference numeral 32 of FIG. 3, and the shape difference between the shot region 20 and the pattern region 8a is gradually reduced as indicated by reference numeral 33 of FIG. 3. During heating of the substrate, the imprint apparatus 1 of the first embodiment stops, while measuring this shape difference by the alignment measurement unit 26, deformation of the shot region 20 by the heating unit 6 at a time $t_a$ when the shape difference falls within the tolerance. Then, the imprint apparatus 1 brings the mold 8 and the resin 14 into contact with each other while the shape difference falls within the tolerance, thereby curing the resin 14. The shape difference may be measured continuously by the alignment measurement unit 26 while the shot region 20 is deformed. However, the shape difference may be measured intermittently. The tolerance can be preset based on, for example, an overlay precision required for the imprint apparatus 1.

As described above, the imprint apparatus 1 of the first embodiment controls, while measuring the shape difference by the alignment measurement unit 26, heating of the substrate by the heating unit 6 based on the measurement result. That is, before deforming the shot region 20 by the heating unit 6, a need to decide a thermal dose (a dose obtained by integrating a heat flow rate with respect to time) to be applied to the substrate based on the shape difference measured by the alignment measurement unit 26 does not arise in the imprint apparatus 1. This makes it possible to deform the shot region on the substrate more easily than a method of deciding the thermal dose based on the shape difference measured by the alignment measurement unit 26 and controlling the heating unit 6 based on the decided thermal dose.

Figure 4:
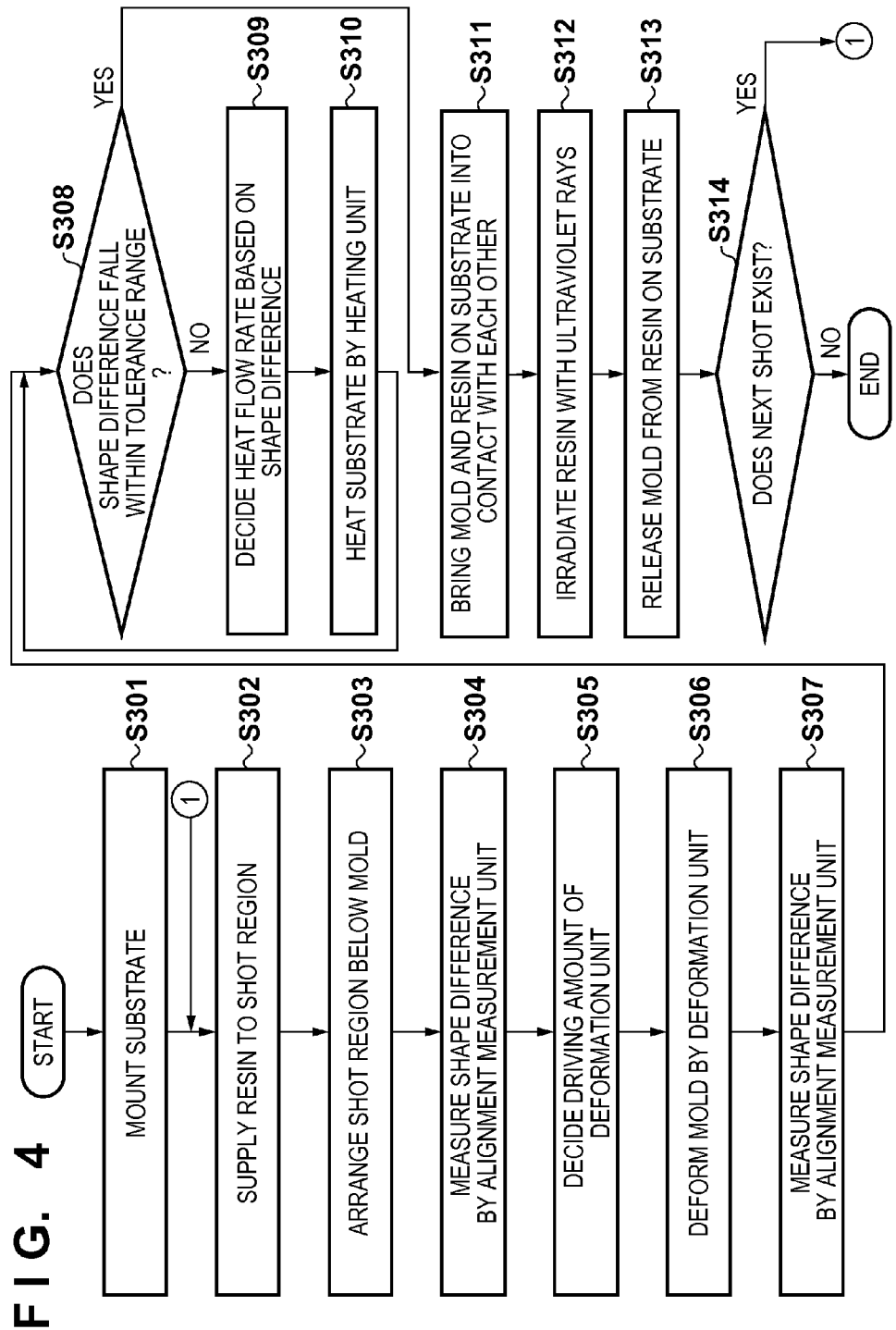
FIG. 4 is a flowchart illustrating an operation sequence in imprint processing.

Imprint processing of transferring the pattern of the mold to each of the plurality of shot regions on the substrate in the imprint apparatus 1 of the first embodiment will be described with reference to FIG. 4. FIG. 4 is a flowchart illustrating an operation sequence in the imprint processing of transferring the pattern of the mold 8 to each of the plurality of shot regions on the substrate.

In step S301, the control unit 7 controls a substrate conveying mechanism (not shown) to convey the substrate 10 on the substrate holding unit 16, and controls the substrate holding unit 16 to hold the substrate 16. By doing so, the substrate 10 is arranged within the imprint apparatus 1. In step S302, the control unit 7 controls the stage driving unit 17 such that the shot region 20 (the shot region to undergo the imprint processing) on the substrate is arranged below the resin supply unit 5 (discharge nozzle 5a). The control unit 7 then controls the resin supply unit 5 to supply the resin 14 (uncured resin) to the shot region 20. In step S303, the control unit 7 controls the stage driving unit 17 such that the shot region 20 supplied with the resin 14 is arranged below the pattern region 8a on the mold 8. In step S304, the control unit 7 causes the alignment measurement unit 26 to measure the shape difference between the pattern region 8a on the mold 8 and the shot region 20 on the substrate. In step S305, the control unit 7 decides, based on the shape difference measured by the alignment measurement unit 26 in step S304, a driving amount of the deformation unit 15 (a force applied to the mold by the deformation unit 15) when the deformation unit 15 deforms the pattern region 8a. In step S306, the control unit 7 controls the deformation unit 15 based on the driving amount decided in step S305 to deform the pattern region 8a on the mold 8. The control unit 7 can decide the driving amount of the deformation unit 15 such that the shape of the pattern region 8a becomes a shape and dimensions in design data. The present invention, however, is not limited to them. For example, the control unit 7 may decide the driving amount of the deformation unit 15 such that the shape of the pattern region 8a becomes an intermediate shape between the shape of the pattern region 8a and that of the shot region 20. Deformation of the pattern region 8a by the deformation unit 15 may be performed at the same time as that of the shot region 20 by the heating unit 6 (to be described later).

In step S307, the control unit 7 causes the alignment measurement unit 26 to measure the shape difference between the pattern region 8a deformed by the deformation unit 15 and the shot region 20. In step S308, the control unit 7 determines whether the shape difference measured by the alignment measurement unit 26 in step S307 falls within the tolerance. If the shape difference measured by the alignment measurement unit 26 falls outside the tolerance, the process advances to step S309. On the other hand, if the shape difference measured by the alignment measurement unit 26 falls within the tolerance, the process advances to step S311. In step S309, the control unit 7 decides the heat flow rate of the heating unit 6 based on the shape difference measured by the alignment measurement unit 26 in step S307. In step S310, the control unit 7 controls the heating unit 6 to heat the substrate with the heat flow rate decided in step S309.

Figure 3:
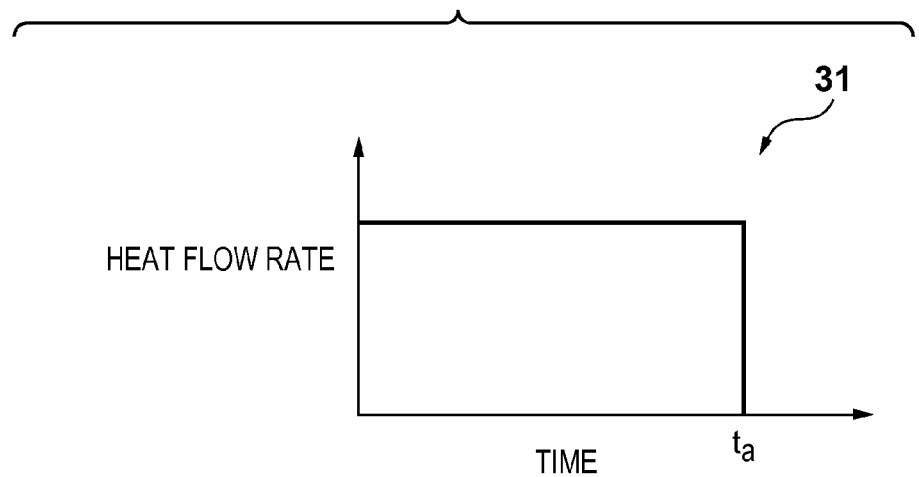
FIG. 3 shows graphs of relationships, with respect to time, of a heat flow rate applied to a substrate by the heating unit, the deformation amount of a shot region, and a shape difference between a pattern region and the shot region.
Figure 3:
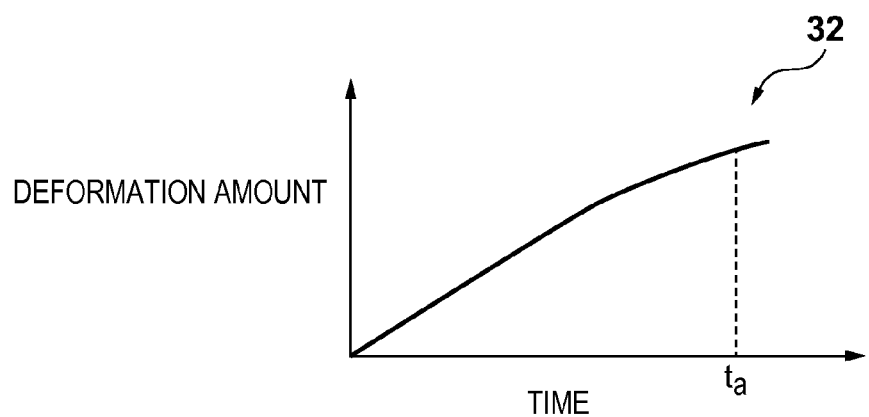
Figure 3:
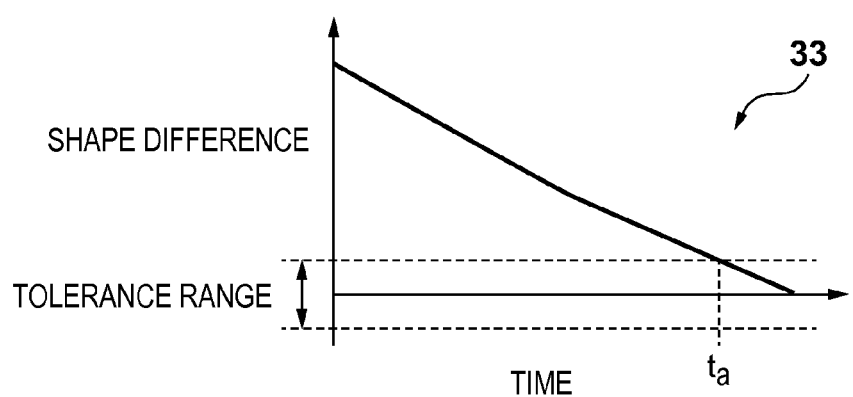
Figure 5:
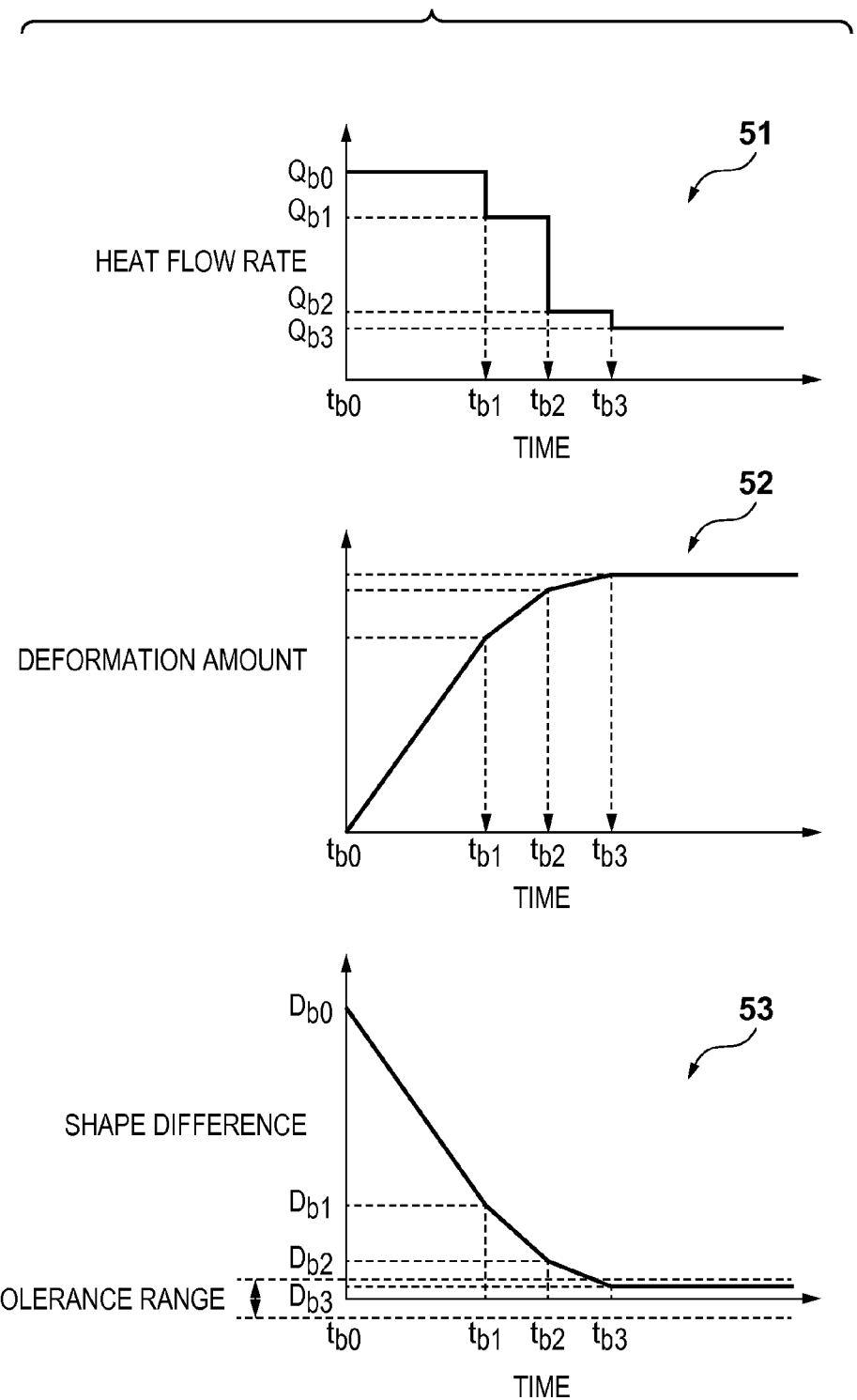
FIG. 5 shows graphs of relationships, with respect to time, of heat flow rates applied to the substrate by the heating unit, the deformation amounts of the shot region, and the shape difference between the pattern region and the shot region.

In an example shown in FIG. 3, the substrate 10 is heated with the fixed heat flow rate. However, if the substrate 10 is heated with the fixed heat flow rate, it may excessively be heated due to the influence of, for example, external disturbance. In this case, a need to wait heat emission from the substrate 10 until the shape difference between the pattern region 8a on the mold 8 and the shot region 20 falls within the tolerance can arise. To prevent the excessive heating of the substrate 10, as shown in FIG. 5, the heating unit 6 may be controlled such that the heat flow rate applied to the substrate 10 is reduced stepwise in accordance with a reduction in a control error (a control deviation) associated with the shape difference (overlay state) measured by the alignment measurement unit 26 in step S309. The heat flow rate is reduced stepwise in an example shown in FIG. 5. The present invention, however, is not limited to this, and the heat flow rate may be reduced continuously.

Reference numeral 51 of FIG. 5 shows a relationship between time and the heat flow rate applied to the substrate 10. Reference numeral 52 of FIG. 5 shows a relationship between the time and the deformation amount of the shot region. Reference numeral 53 of FIG. 5 shows a relationship between the shape difference and the time. In FIG. 5, for example, let $D_{b0}$ be the shape difference measured by the alignment measurement unit 26 at a time $t_{b0}$ (heating start time). The control unit 7 decides a heat flow rate $Q_{b0}$ to be applied to the substrate 10 based on the shape difference $D_{b0}$. The control unit 7 then controls the heating unit 6 to heat the substrate with the heat flow rate $Q_{b0}$ until the shape difference measured by the alignment measurement unit 26 reaches a predetermined value $D_{b1}$ (for example, a predetermined ratio of the shape difference $D_{b0}$).

Assume that the shape difference measured by the alignment measurement unit 26 reaches the predetermined value $D_{b1}$ at a time $t_{b1}$. At this time, the control unit 7 decides a heat flow rate $Q_{b1}$ to be applied to the substrate 10 based on the shape difference ($\approx$ the predetermined value $D_{b1}$) measured by the alignment measurement unit 26 at the time $t_{b1}$. The control unit 7 then controls the heating unit 6 to heat the substrate 10 with the heat flow rate $Q_{b1}$ until the shape difference measured by the alignment measurement unit 26 reaches a predetermined value $D_{b2}$ (for example, a predetermined ratio of the predetermined value $D_{b1}$). Furthermore, assume that the shape difference measured by the alignment measurement unit 26 reaches the predetermined value $D_{b2}$ at a time $t_{b2}$. At this time, the control unit 7 decides a heat flow rate $Q_{b2}$ to be applied to the substrate 10 based on the shape difference ($\approx$ the predetermined value $D_{b2}$) measured by the alignment measurement unit 26 at the time $t_{b2}$. The control unit 7 then controls the heating unit 6 to heat the substrate 10 with the heat flow rate $Q_{b2}$ until the shape difference measured by the alignment measurement unit 26 falls within a tolerance, and stops deformation of the shot region 20 by the heating unit 6 at a time $t_{b3}$ when the measured shape difference falls within the tolerance. It is possible to prevent excessive heating of the substrate by reducing the heat flow rates applied to the substrate 10 based on a control error associated with the shape differences measured by the alignment measurement unit 26, as described above. The predetermined ratio may be, for example, 50% to 90%, and can be preset by a user or the like before performing imprint processing. The number of times the heat flow rate is changed while the heating unit 6 deforms the shot region can also be preset by the user or the like before performing the imprint processing. An example of a method of deciding the heat flow rate by the control unit 7 based on the shape difference is as follows. As one method, the control unit 7 sets a plurality of classes in the control error associated with the shape difference, and assigns a predetermined heat flow rate to each class. The control unit 7 then decides a heat flow rate based on the heat flow rate assigned to each class and the measured shape difference. In addition, as another method, the control unit 7 decides a heat flow rate to reduce the heat flow rate in the predetermined ratio described above.

Referring back to FIG. 4, in step S311, the control unit 7 controls the mold driving unit 12 to bring the mold 8 into contact with the resin 14 on the substrate. In step S312, the control unit 7 controls the exposure unit 2 to irradiate, with ultraviolet rays, the resin 14 which is in contact with the mold 8, thereby curing the resin 14. In step S313, the control unit 7 controls the mold driving unit 12 to release the mold 8 from the resin 14 on the substrate. In step S314, the control unit 7 determines whether there exists a shot region (next shot region) on the substrate, to which the pattern of the mold 8 is to be subsequently transferred. If there exists a next shot region, the process returns to step S302; otherwise, imprint processing ends. In FIG. 4, the shot region 20 is deformed by the heating unit 6, and the mold 8 and the resin 14 on the substrate are brought into contact with each other while the shape difference measured by the alignment measurement unit falls within the tolerance. The present invention, however, is not limited to them. For example, the mold 8 and the resin 14 on the substrate are brought into contact with each other, and then the shot region 20 may be deformed by the heating unit 6 in that state. That is, step S311 may be performed before step S307 in FIG. 4. Also, during a period in which the exposure unit 2 irradiates the resin 14 with ultraviolet rays (step S312) as well, the heating unit 6 may heat the substrate 10 to keep the shape difference measured by the alignment measurement unit 26 within the tolerance. At this time, exposure heat generated by irradiating the resin 14 with ultraviolet rays by the exposure unit 2 is added to the substrate 10. Therefore, the control unit 7 may reduce a heat flow rate that the heating unit 6 adds to the substrate by an amount corresponding to the heat amount of the exposure heat (a heat amount for curing the resin 14).

As described above, the imprint apparatus 1 of the first embodiment includes the heating unit 6 which deforms the shot region 20 by adding heat to the substrate 10. The imprint apparatus 1 of the first embodiment controls, while measuring the shape difference between the shot region 20 on the substrate and the pattern region 8a on the mold 8 by the alignment measurement unit 26, heating of the substrate by the heating unit 6 such that the measured shape difference falls within the tolerance. When the shape difference measured by the alignment measurement unit 26 falls within the tolerance, the imprint apparatus 1 stops deformation of the shot region 20 by the heating unit 6, and brings the mold 8 and the resin 14 into contact with each other while the shape difference falls within the tolerance, thereby curing the resin 14. This makes it possible to overlay the shot region 20 on the substrate and the pattern region 8a on the mold 8 with high accuracy, and transfer the pattern of the mold 8 to the shot region 20 accurately.

Second Embodiment

An imprint apparatus according to the second embodiment of the present invention will be described. In an imprint apparatus 1 of the second embodiment, after a shape difference measured by an alignment measurement unit 26 falls within a tolerance, a heating unit 6 heats a substrate 10 to keep the shape difference measured by the alignment measurement unit 26 within the tolerance. A method of keeping the shape difference within the tolerance based on measurement by the alignment measurement unit 26 will be described below. The apparatus arrangement of the imprint apparatus of the second embodiment is the same as that of the imprint apparatus 1 of the first embodiment, and a description thereof will be omitted.

Figure 6:
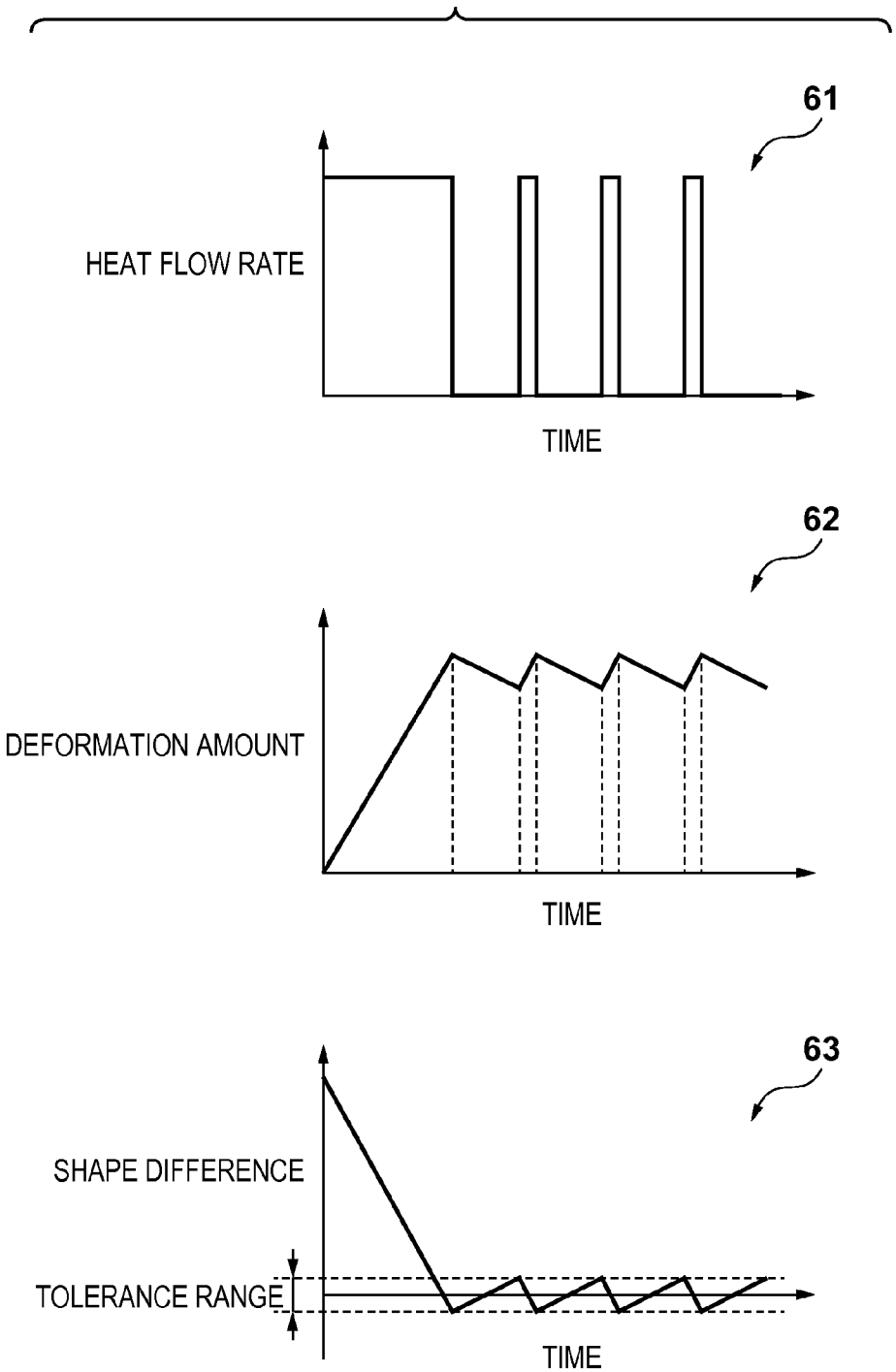
FIG. 6 shows graphs for explaining a method of keeping a shape difference within a tolerance.

FIG. 6 shows graphs for explaining the method of keeping the shape difference within the tolerance based on the measurement by the alignment measurement unit 26. Reference numeral 61 of FIG. 6 shows a relationship between time and a heat flow rate applied to the substrate 10. Reference numeral 62 of FIG. 6 shows a relationship between the time and a deformation amount of a shot region 20. Reference numeral 63 of FIG. 6 shows a relationship between a shape difference and the time. In reference numeral 63 of FIG. 6, if the shape difference is positive, the dimension of a pattern region 8a is larger than that of the shot region 20, and if the shape difference is negative, the dimension of the pattern region 8a is smaller than that of the shot region 20. While measuring the shape difference by the alignment measurement unit 26, a control unit 7 stops, after the shape difference measured by the alignment measurement unit 26 falls within the tolerance, heating of the substrate 10 by the heating unit 6 when the shape difference falls below one end (lower limit value) which defines the tolerance as a trigger. Also, the control unit 7 restarts heating of the substrate 10 by the heating unit 6 when the shape difference measured by the alignment measurement unit 26 exceeds other end (upper limit value) which defines the tolerance as a trigger. As described above, the imprint apparatus of the second embodiment repeats, as indicated by reference numeral 61 of FIG. 6, the stop and the restart of heating by the heating unit 6 when the shape difference measured by the alignment measurement unit 26 exceeds the tolerance as a trigger. This makes it possible to keep the shape difference between the pattern region 8a and the shot region 20 within the tolerance, and bring a mold 8 and a resin 14 on the substrate into contact with each other in a state in which the temperature of the substrate 10 is stable, that is, a state in which deformation of the shot region 20 is stable.

Third Embodiment

An imprint apparatus according to the third embodiment will be described. In the imprint apparatus according to the third embodiment, a heating unit 6 independently heats a plurality of portions included in a shot region 20. This makes it possible to obtain a temperature distribution in the shot region 20, and deform the shot region 20 such that a shape difference between the shot region 20 and a pattern region 8a falls within a tolerance. In the third embodiment, the plurality of portions are all included in the shot region. The present invention, however, is not limited to this, and may include a portion arranged outside the shot region. The apparatus arrangement of the imprint apparatus of the third embodiment is the same as that of the imprint apparatus 1 of the first embodiment, and a description thereof will be omitted.

Figure 7:
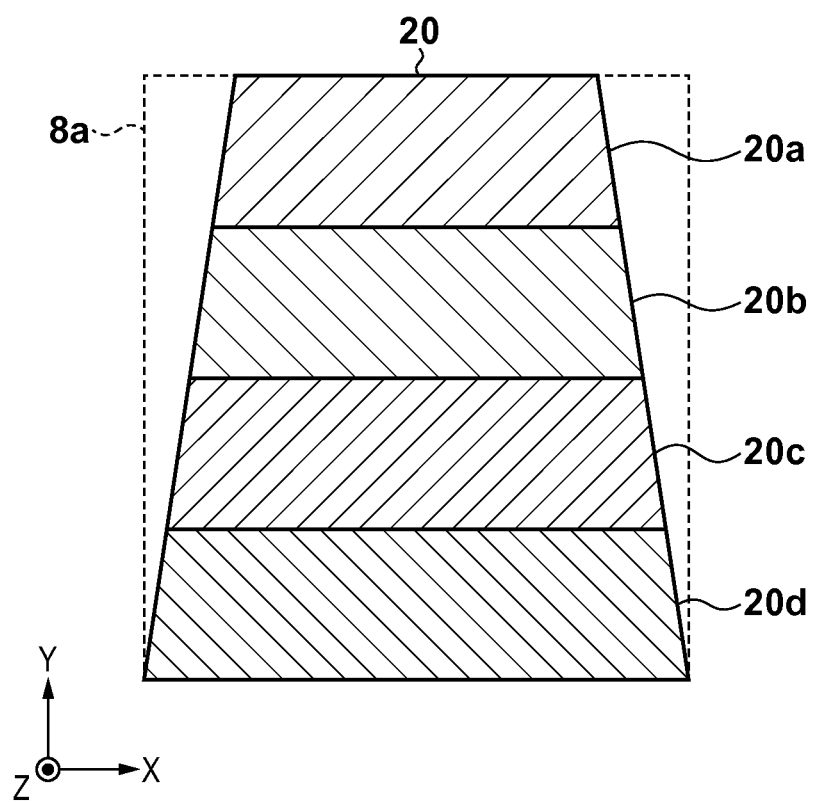
FIG. 7 is a view showing a shot region.
Figure 8:
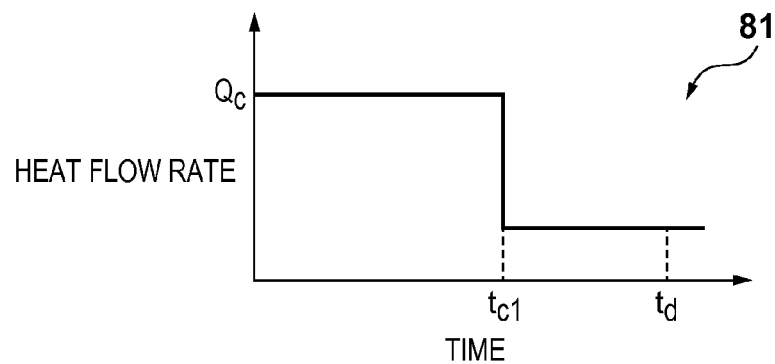
FIG. 8 shows graphs of relationships between time and a heat flow rate applied to each portion of a shot region.
Figure 8:
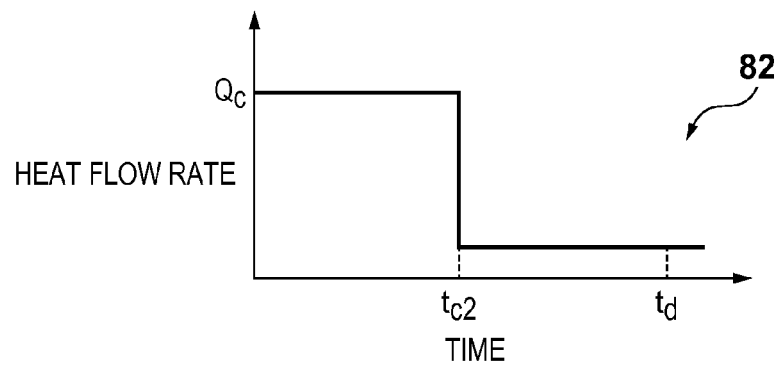
Figure 8:
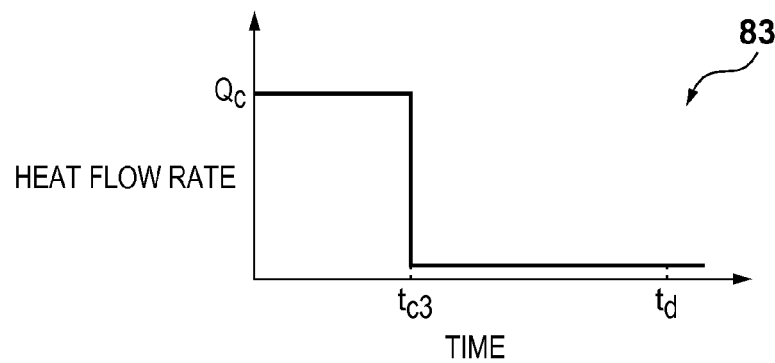
Figure 8:
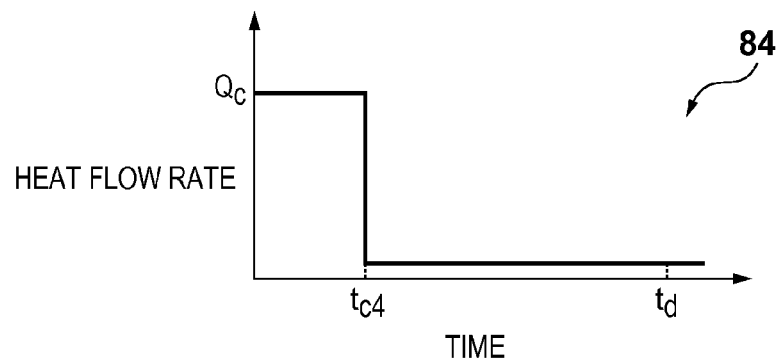

As shown in FIG. 7, assume that deformation only including a trapezoid component in the shot region 20 occurs, and each portion of the shot region 20 is heated such that the shape of the shot region 20 conforms to the shape (a broken line in FIG. 7) of the pattern region 8a on a mold 8. For the sake of descriptive convenience, as shown in FIG. 7, the shot region 20 includes four portions 20a, 20b, 20c, and 20d, and only deformation in an X direction in each of the portions 20a to 20d is considered. The imprint apparatus of the third embodiment controls, while measuring a shape difference in each of portions 20a to 20d of the shot region 20 by an alignment measurement unit 26, heating of a substrate 10 by the heating unit 6 such that the shape difference in each of the portions 20a to 20d falls within a tolerance. FIG. 8 shows relationships between time and a heat flow rate applied to each of the portions 20a to 20d. Reference numerals 81, 82, 83, and 84 in FIG. 8 are graphs each showing the relationship between the time and the heat flow rate applied to each of the portions 20a to 20d.

For example, a control unit 7 adds a common heat flow rate $Q_c$ to each of the portions 20a to 20d while measuring the shape difference in each of the portions 20a to 20d by the alignment measurement unit 26. In this case, in the portion 20a, the control unit 7 controls the heating unit 6 to heat the portion 20a with the heat flow rate $Q_c$, as indicated by reference numeral 81 of FIG. 8. The control unit 7 then terminates the heating with the heat flow rate $Q_c$ when the shape difference in the portion 20a measured by the alignment measurement unit 26 falls within the tolerance. Let $t_{c1}$ be a time when the shape difference in the portion 20a measured by the alignment measurement unit 26 falls within the tolerance. After the time $t_{c1}$, the control unit controls heating of the substrate 10 by the heating unit 6 to keep the shape difference in the portion 20a within the tolerance. As a method of heating the substrate to keep the shape difference within the tolerance, for example, heating of the substrate 10 is stopped and restarted when the shape difference measured by the alignment measurement unit 26 exceeds the tolerance as a trigger, as described in the second embodiment. In addition, as another method, an amount of heat radiated from the shot region 20 is calculated, and the calculated heat amount is applied to the substrate as a heat flow rate. The heat radiated from the shot region 20 includes, for example, heat which diffuses within the substrate 10, heat which is transferred from the substrate 10 to a fluid such as air, and heat which is transferred from the substrate 10 to a substrate holding unit 16. Therefore, the heat radiated from the shot region can be calculated in consideration of such heat and the temperature of the shot region 20.

In the portion 20b, the control unit 7 controls the heating unit 6 to heat the portion 20b with the heat flow rate $Q_c$, as indicated by reference numeral 82 of FIG. 8. The control unit 7 then terminates the heating with the heat flow rate $Q_c$ when the shape difference in the portion 20b measured by the alignment measurement unit 26 falls within the tolerance. Let $t_{c2}$ be a time when the shape difference in the portion 20b measured by the alignment measurement unit 26 falls within the tolerance. After the time $t_{c2}$ the control unit 7 controls heating of the substrate 10 by the heating unit 6 to keep the shape difference in the portion 20b within the tolerance. In a similar manner, in the portion 20c (portion 20d), the control unit 7 controls the heating unit 6 to heat the portion 20c (portion 20d) with the heat flow rate $Q_c$, as indicated by reference numeral 83 of FIG. 8 (reference numeral 84 of FIG. 8). The control unit 7 then terminates the heating with the heat flow rate $Q_c$ when the shape difference in the portion 20c (portion 20d) measured by the alignment measurement unit 26 falls within the tolerance. Let $t_{c3}$ be a time when the shape difference in the portion 20c measured by the alignment measurement unit 26 falls within the tolerance, and $t_{c4}$ be a time when the shape difference in the portion 20d measured by the alignment measurement unit 26 falls within the tolerance. In the portions 20c and 20d, after the times $t_{c3}$ and $t_{c4}$, the control unit 7 controls heating the substrate by the heating unit 6 to keep the shape differences in the portions 20c and 20d within the tolerance, respectively. When the control unit 7 controls heating of the substrate by the heating unit 6 to keep the shape difference in each of the portion 20a to 20d within the tolerance, for example, at a time $t_d$ in FIG. 8, a mold 8 and a resin 14 on the substrate are brought into contact with each other.

As described above, the imprint apparatus of the third embodiment independently heats the respective portions 20a to 20d included in the shot region 20 by the heating unit 6. As in the first embodiment, this makes it possible to overlay the shot region 20 on the substrate and the pattern region 8a on the mold 8 with high accuracy, and transfer the pattern of the mold 8 to the shot region 20 accurately. In the third embodiment, the common heat flow rate $Q_c$ is applied to each of the portions 20a to 20d included in the shot region 20. The present invention, however, is not limited to this, and may apply heat flow rates of different sizes to the respective portions 20a to 20d. For example, the heat flow rates to be added to the respective portions 20a to 20d may be decided such that the time when the shape difference measured by the alignment measurement unit falls within the tolerance is the same in each of the portions 20a to 20d. Furthermore, as described in the first embodiment with reference to step S307 of FIG. 4 and FIG. 5, the control unit 7 may change a heat flow rate to be added to each portion based on the shape difference measured by the alignment measurement unit 26 during a period in which the shot region 20 is deformed by the heating unit 6.

<Embodiment of Method of Manufacturing Article>

A method of manufacturing an article according to embodiments of the present invention is suitable for manufacturing an article, for example, a microdevice such as a semiconductor device or an element having a microstructure. The method of manufacturing an article according to this embodiment includes a step of forming a pattern on a resin applied on a substrate (a step of performing imprint processing on the substrate) by using the above-described imprint apparatus, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-206804 filed on Oct. 1, 2013, which is hereby incorporated by reference herein in its entirety.

What is claimed is:

1. An imprint apparatus for molding an imprint material on a target region on a substrate using a mold to form a pattern on the target region, the apparatus comprising:
    a heater configured to deform the target region by heating the substrate;
    a measurement device configured to measure an overlay state between the target region and the mold; and
    a controller configured to control the heater while causing the measurement device to measure the overlay state, such that the measured overlay state falls within a tolerance and then keeps within the tolerance,
    wherein the controller is configured to control, during cure of the imprint material, the heater such that a thermal dose per unit time to be applied to the target region by the heater is reduced by a heat amount due to curing the imprint material.

2. The apparatus according to claim 1, wherein the controller is configured to control the heater such that a thermal dose per unit time is reduced stepwise in accordance with the measured overlay state.

3. The apparatus according to claim 2, wherein the controller is configured to control the heater based on the thermal dose per unit time assigned to each of a plurality of classes of the overlay state.

4. The apparatus according to claim 1, wherein the controller is configured to control the heater, such that after the measured overlay state first falls within the tolerance, the measured overlay state keeps so as to keep the overlay state within the tolerance.

5. The apparatus according to claim 1, wherein the controller is configured to bring the mold and the imprint material into contact with each other if the measured overlay state falls within the tolerance.

6. The apparatus according to claim 1, wherein the controller is configured to control the heater so as to heat the substrate in a state in which the mold and the imprint material are in contact with each other.

7. The apparatus according to claim 1, further comprising a deformation device configured to deform the mold,
    wherein the controller is configured to control the heater and the deformation device such that the overlay state falls within the tolerance.

8. The apparatus according to claim 1, wherein the heater includes a light source, and is configured to heat the substrate by irradiating the substrate with light emitted from the light source.

9. A method of manufacturing an article, the method comprising steps of:
    forming a pattern on a substrate using an imprint apparatus; and
    processing the substrate, on which the pattern has been formed, to manufacture the article,
    wherein the imprint apparatus molds an imprint material on a target region on the substrate using a mold to form the pattern on the target region, and includes:
    a heater configured to deform the target region by heating the substrate;
    a measurement device configured to measure an overlay state between the target region and the mold; and
    a controller configured to control the heating device heater while causing the measurement device to measure the overlay state, such that the measured overlay state falls within a tolerance and then keeps within the tolerance,
    wherein the controller is configured to control, during cure of the imprint material, the heater such that a thermal dose per unit time to be applied to the target region by the heater is reduced by a heat amount due to curing the imprint material.

10. The apparatus according to claim 1, wherein the controller is configured to control the heater such that after the measured overlay state first falls within the tolerance, the measured overlay state does not overshoot from the tolerance by causing the heater to reduce a thermal dose to the target region per unit time.

11. The apparatus according to claim 1, wherein the controller is configured to control the heater such that after the measured overlay state first falls within the tolerance, the measured overlay state keeps within the tolerance by repeating a stop and a restart of heating the substrate.

12. The apparatus according to claim 1, wherein the controller is configured to control the heater such that after the measured overlay state first falls within the tolerance, the measured overlay state keeps within the tolerance by repeating a stop and a restart of heating the substrate when the measured overlay state exceeds the tolerance as a trigger.

* * * * *